United States Patent
Tzu et al.

[11] Patent Number: 6,007,324
[45] Date of Patent: Dec. 28, 1999

[54] DOUBLE LAYER METHOD FOR FABRICATING A RIM TYPE ATTENUATING PHASE SHIFTING MASK

[75] Inventors: San-De Tzu; Shy-Jay Lin, both of Taipei; Ching-Chia Lin, Keelong, all of Taiwan

[73] Assignee: Taiwan Semiconductor Manufacturing Company, Ltd., Hsin-Chu, Taiwan

[21] Appl. No.: 09/166,392

[22] Filed: Oct. 5, 1998

Related U.S. Application Data

[63] Continuation-in-part of application No. 08/956,971, Oct. 23, 1977, Pat. No. 5,853,923.

[51] Int. Cl.$^6$ .......................................................... G03F 9/00
[52] U.S. Cl. .............................................. 431/5; 430/394
[58] Field of Search ............................... 430/5, 322, 323, 430/324, 394

[56] References Cited

U.S. PATENT DOCUMENTS

| | | | |
|---|---|---|---|
| 5,244,759 | 9/1993 | Pierrat | 430/5 |
| 5,384,219 | 1/1995 | Dao et al. | 430/5 |
| 5,460,908 | 10/1995 | Reinberg | 430/5 |
| 5,472,813 | 12/1995 | Nakagawa et al. | 430/5 |
| 5,532,089 | 7/1996 | Adair et al. | 430/5 |
| 5,582,939 | 12/1996 | Pierrat | 430/5 |
| 5,620,817 | 4/1997 | Hsu et al. | 430/5 |

OTHER PUBLICATIONS

Chang et al. ULSI Technology, The McGraw–Hill Companies, Inc. 1997. pp. 284–289, 311–312.

Takahashi et al. "Primary Processes in E–Beam and Laser Lithographies for Phase–Shift Mask Manufacturing".

P. Rai–Choudhury, "Handbook of Microlithography, Micromaching, and Microfabrication" vol. 1:Microlithography. SPIE Optical Engineering Press, 1997, pp. 435–437.

*Primary Examiner*—S. Rosasco
*Attorney, Agent, or Firm*—George O. Saile; Stephen B. Ackerman; Larry J. Prescott

[57] ABSTRACT

A method of forming a rim type attenuating phase shifting mask which requires only one resist layer and developing the resist using a single developing solution. A transparent mask substrate has a layer of attenuating phase shifting material, a layer of opaque material, and a layer of resist material formed thereon. The layer of resist is exposed to a first pattern using a first exposure dose and a second pattern using a smaller second exposure dose. The resist is developed for a first time forming the first pattern in the entire layer of resist and the second pattern in the top portion of the layer of resist. The first pattern is then etched in the layer of opaque material using the first pattern in the layer of resist as a mask. In one embodiment the first pattern is then etched in the layer of attenuating phase shifting material, the resist is partially etched using an $O_2$ plasma etch leaving the second pattern in the lower part of the resist, the second pattern is etched in the layer of opaque material, and the resist is stripped. In a second embodiment the layer of resist is developed for a second time in the same solution forming the second pattern in the entire resist layer, the first pattern is etched in the layer of attenuating phase shifting material, the second pattern is etched in the layer of opaque material, and the resist is stripped.

22 Claims, 4 Drawing Sheets

DOUBLE LAYER METHOD FOR FABRICATING A RIM TYPE ATTENUATING PHASE SHIFTING MASK

This is a Continuation-in-Part Application of Ser. No. 08/956,971, filed Oct. 23, 1977 now U.S. Pat. No. 5,853,923, entitled "A NEW DOUBLE LAYER METHOD FOR FABRICATING A RIM TYPE ATTENUATING PHASE SHIFTING MASK", now pending.

BACKGROUND OF THE INVENTION

1. Field of the Invention

This invention relates to methods of forming rim type attenuating phase shifting masks using a single layer of resist material and a single resist developing solution.

2. Description of the Prior Art

Patent Application TSMC-97-077, Ser. No. 08/957,676, filed Oct. 24, 1977, entitled "A NEW MASK AND METHOD TO ELIMINATE SIDE-LOBE EFFECTS IN ATTENUATED PHASE SHIFTING MASKS," and assigned to the same assignee describes the use of rim type attenuating phase shifting masks.

A paper entitled "Primary Process in E-Beam and Laser Lithographies for Phase-Shift Mask Manufacturing" by Yoichi Takahashi et al., SPIE Vol. 1674 Optical/Laser Microlithography V, 1992, pages 216–229 describes a comparison of using a LASER writer as opposed to an electron beam writer in the fabrication of phase shifting masks.

"ULSI Technology," by C. Y. Chang and S. M. Sze, McGraw-Hill, 1996, pages 284–289 describes making rim type phase shifting masks using electron beam direct writing, two layers of resist, and two developing steps.

"ULSI Technology," by C. Y. Chang and S. M. Sze, McGraw-Hill, 1996, pages 311–312 describes a double exposure of two layers of resist with different sensitivities. The top layer of resist has a higher sensitivity than the lower layer of resist. The top layer of resist is first exposed and developed followed by exposure and developing of the second layer of resist.

U.S. Pat. No. 5,620,817 to Hsu et al. describes a method of forming a rim type attenuating phase shifting mask by exposing a layer of negative photoresist through the back surface of a transparent mask substrate using a patterned layer of attenuating phase shifting material as a mask. The exposed and developed photoresist forms pedestals with sloping sides. Opaque material is then deposited using the pedestal overhang to form a rim type mask.

U.S. Pat. No. 5,532,089 to Adair et al. and U.S. Pat. No. 5,384,219 to Dao et al. describe methods of forming a phase shifting mask which differ from the method of this invention.

U.S. Pat. No. 5,244,759 to Pierrat describes a method of forming a phase shifting mask using a single resist layer using two exposure doses and two developing steps. After the two exposure doses the resist layer is developed a first time in a first developing solution and used for etching part of the mask. The resist layer is then developed a second time in a second developing solution and used for further etching of the mask. In this method two developing steps in two different developing solutions are required.

U.S. Pat. No. 5,582,939 to Pierrat describes a method of avoiding defects in forming phase shifting masks using an etch stop layer, a phase shifting layer, and an opaque layer.

U.S. Pat. No. 5,472,813 to Nakagawa et al. describes a pattern exposing method to form a predetermined resist pattern on a substrate using a first resist layer and a second resist layer.

U.S. Pat. No. 5,460,908 to Reinberg describes a method of forming a phase shifting reticle that can be used as a mask.

"Handbook of Microlithography, Micromachining, and Microfabrication," Volume 1: Microlithography, P. Rai-Choudhury, Editor, SPIE Optical Engineering Press, 1997, pages 435–437 describes process sequencing for masks patterned using electron-beam and LASER based exposure sources.

This invention describes methods of forming rim type attenuating phase shifting masks using a single resist layer and a single developing solution.

SUMMARY OF THE INVENTION

In the manufacture of integrated circuit wafers photolithographic processing has a very important role. Phase shifting masks are frequently used where critical dimensions are increasingly small or where depth of focus is important. Lithographic masks using attenuating phase shifting materials, materials which both attenuate and shift the phase of the incident light, are used in a number of applications because of the ease of mask design and mask fabrication for these masks.

Although easy mask design and mask fabrication are key advantages for masks using attenuating phase shifting materials they also have problems such as side lobe effect. Side lobe effect occurs because the intensity of the light which does pass through the attenuating phase shifting material is not zero and this effect can partially expose the resist at pattern edges. Rim type attenuating phase shifting masks are used to overcome the problems of the side lobe effect and retain the advantages of attenuating phase shifting masks. In rim type attenuating phase shifting masks a mask pattern is defined using attenuating phase shifting material. A second pattern of opaque material is then formed over the attenuating phase shifting material leaving a gap width of attenuating phase shifting material which is not covered by the opaque material. The attenuating phase shifting material defines the pattern and the opaque material prevents the problems of side lobe effect from occurring.

Rim type attenuating phase shifting masks are effective in preventing the problems due to side lobe effect but they are more complicated and expensive to fabricate. Typically a first resist layer is exposed and developed to form a pattern in a layer of attenuating phase shifting material. The first resist layer is then stripped and a second resist layer is exposed and developed to form a pattern in the opaque material in order to form the rim type mask. The exposure of the resist layers is usually accomplished using an electron beam so a conductive layer coating must be formed on the second resist layer.

It is a principle objective of this invention to provide a method for forming rim type masks which requires a single resist layer and a single developing step of the resist layer using a single developing solution in order to form a rim type mask.

It is another principle objective of this invention to provide a method for forming rim type masks which requires a single resist layer and two developing steps of the resist layer using a single developing solution in order to form a rim type mask.

These objectives are achieved using a single layer of resist. The layer of resist is formed over two layers of mask material which are formed on a transparent mask substrate. A first pattern is exposed in the layer of resist using a first exposure dose which is sufficient to expose the first pattern through the entire thickness of the layer of resist. A second pattern is then exposed in the layer of resist using a second exposure dose, which is lower than the first exposure dose, which exposes the second pattern in the top portion of the layer of resist to a greater degree than in the bottom portion of the resist. The resist is then developed for a first time in the developing solution.

In one embodiment the first pattern in the resist is then used to transfer the first pattern to mask material as desired. Part of the layer of resist is then etched away using an $O_2$ plasma etch, which is anisotropic, so that the second pattern is formed in the remaining part of the resist layer. The second pattern in the remaining part of the resist is then used to transfer the second pattern to mask material as desired. The remaining part of the resist layer is then stripped and the mask is completed.

In another embodiment the first pattern in the resist is used to transfer the first pattern to mask material as desired. The resist is then developed for a second time in the same developing solution and the second pattern is formed in the layer of resist. The second pattern in the layer of resist is then used to transfer the second pattern to mask material as desired. The resist layer is then stripped and the mask is completed.

DESCRIPTION OF THE PREFERRED EMBODIMENTS

Figure 1:
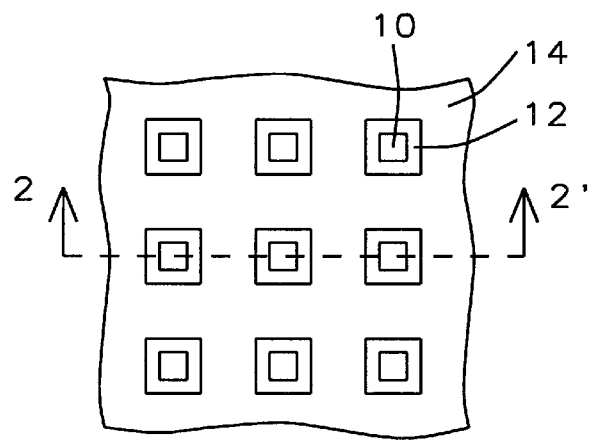
FIG. 1 shows a top view of a rim type attenuating phase shifting mask.
Figure 2:
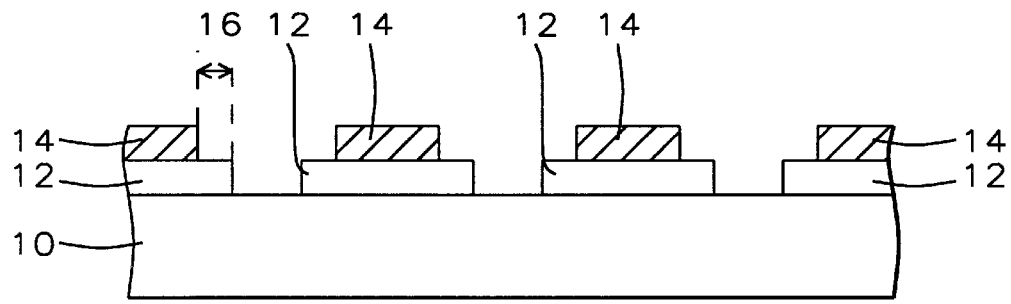
FIG. 2 shows a cross section view of the attenuating phase shifting mask of FIG. 1 taken along line 2-2' of FIG. 1.

FIG. 1 shows a top view of a rim type attenuating phase shifting mask showing a first pattern formed in attenuating phase shifting material 12 exposing parts of the transparent mask substrate 10. A second pattern formed in opaque material 14 covers all of the attenuating phase shifting material except a rim at the pattern edge. FIG. 2 shows a cross section view of the same rim type attenuating phase shifting mask shown in FIG. 1 along line 2-2' of FIG. 1. The mask is formed on a transparent mask substrate 10, such as quartz. A first pattern is formed in a layer of attenuating phase shifting material 12, such as MoSiON, which has been deposited on the transparent mask substrate 10. A second pattern is formed in a layer of opaque material 14, such as chrome, which has been deposited on the layer of attenuating phase shifting material 12. The first pattern in the attenuating phase shifting material 12 is the pattern that will be transferred to an integrated circuit wafer by the mask. The second pattern in the opaque material 14 forms a rim at the pattern edge of the first pattern leaving a gap width 16 of attenuating phase shifting material 12 exposed. Gap widths of between about 0.1 and 0.4 micrometers have been shown to eliminate the side lobe problem with a gap width of about 0.4 micrometer giving the best image resolution for a 0.35 micrometer contact hole using an i-line stepper.

This example shows a mask pattern suitable for forming via holes or the like in the manufacture of integrated circuit wafers. Those skilled in the are will readily recognize that rim type attenuating phase shifting mask can also be used for other purposes, such as the formation of electrodes in the manufacture of integrated circuit wafers.

Figure 3:
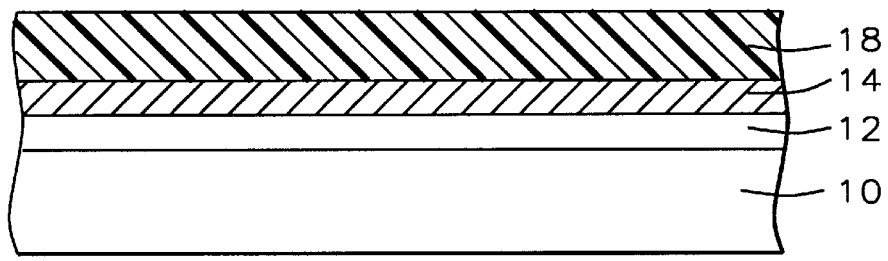
FIG. 3 shows a cross section view of a transparent mask substrate with a layer of attenuating phase shifting material, a layer of opaque material, and a layer of resist material formed thereon.

An embodiment of the method of this invention will now be described with reference to FIGS. 3–10. FIG. 3 shows a cross section of a transparent mask substrate 10 with a layer attenuating phase shifting material 12 formed thereon. A layer of opaque material 14 is formed on the layer of attenuating phase shifting material 12. A layer of resist material 18 is formed on the layer of opaque material 14. In this example the transparent mask substrate 10 is quartz having a thickness of between about 0.2 and 0.3 inches, the layer of attenuating phase shifting material 12 is MoSiON having a thickness of between about 1000 and 1360 nanometers, and the layer of opaque material is chrome having a thickness of between about 80 and 120 nanometers. The thickness of the attenuating phase shifting material is chosen to provide a 180° phase shift, or an odd multiple of a 180° phase shift, and a transmission of between about 3% and 10% of the incident light for light having the wavelength of light which will be used to illuminate the mask when transferring a pattern to an integrated circuit wafer, in this example 365 nanometers or 263 nanometers. The resist is an electron beam resist.

This example describes a method of forming a rim type attenuating phase shifting mask. Those skilled in the art will readily recognize that the method will work equally well for the formation of rim type masks using a layer of a first mask material and a layer of a second mask material and is not restricted to attenuating phase shifting material and opaque material.

Figure 4:
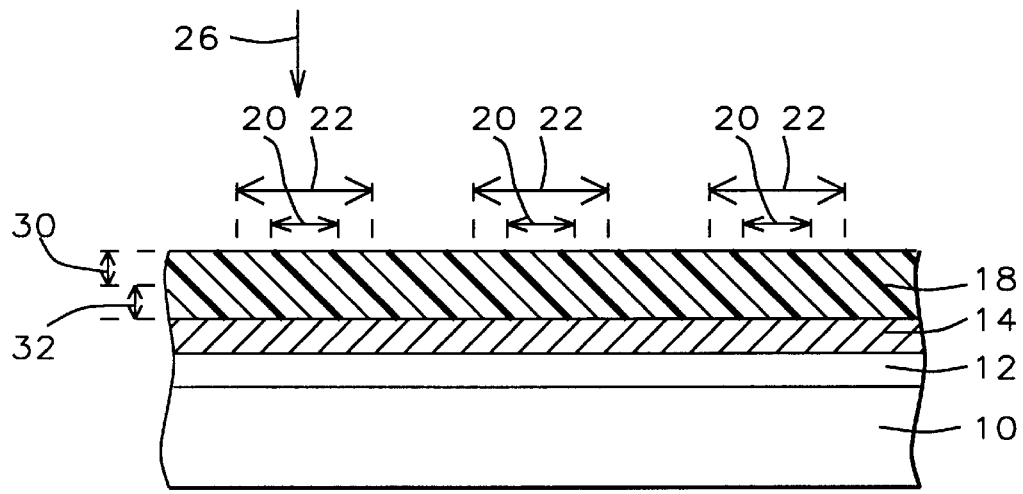
FIG. 4 shows a cross section of the transparent mask substrate, layer of attenuating phase shifting material, layer of opaque material, and layer of resist material after the layer of resist material has been exposed twice, a first time using a first exposure dose and a second time using a second exposure dose.

As shown in FIG. 4, the resist layer 18 is then exposed, using a first exposure dose, to a first pattern 20 using an electron beam 26. The first exposure dose is sufficient to expose the first pattern 20 through the entire thickness of the layer of resist 18. The resist layer is then exposed, using a second exposure dose, to a second pattern 22 also using an electron beam 26. The second exposure dose is sufficient to expose the second pattern 22 through only the top portion 30 of the layer of resist material 18. The second exposure dose is not sufficient to expose the bottom portion 32 of the layer of resist material. In this example the layer of resist material is an electron beam resist having a thickness of between about 3000 and 5000 Angstroms, the first exposure dose is between about 5 micro-curies/cm$^2$ and 8 micro-curies/cm$^2$, and the second exposure dose is between about 2 micro-curies/cm$^2$ and 3 micro-curies/cm$^2$.

Referring again to FIG. 4, a LASER beam can also be used at two different intensity levels to expose the resist layer. In the example of a LASER beam the LASER beam is represented by the arrow indicated by Reference umber 26. In the example of a LASER beam exposure a first exposure dose of a first intensity for a first time is used to expose the first pattern 20 through the entire thickness of the layer of resist 18. The resist layer is then exposed to a second pattern 22, using a second exposure dose of a second intensity of the LASER beam for a second time. The second exposure dose is sufficient to expose the second pattern 22 through only the top portion 30 of the layer of resist material 18.

This example has described using the electron beam 26 to expose the first pattern 20 in the layer of resist 18 using a first exposure dose followed by using the electron beam 26 to expose the second pattern 22 in the top portion 30 of the layer of resist material 18 using a second exposure dose. These exposure steps can be reversed using the electron beam 26 to expose the second pattern 22 in the top portion 30 of the layer of resist 18 using a second exposure dose followed by using the electron beam 26 to expose the first pattern 20 in the layer of resist material 18 using a first exposure dose.

Figure 5:
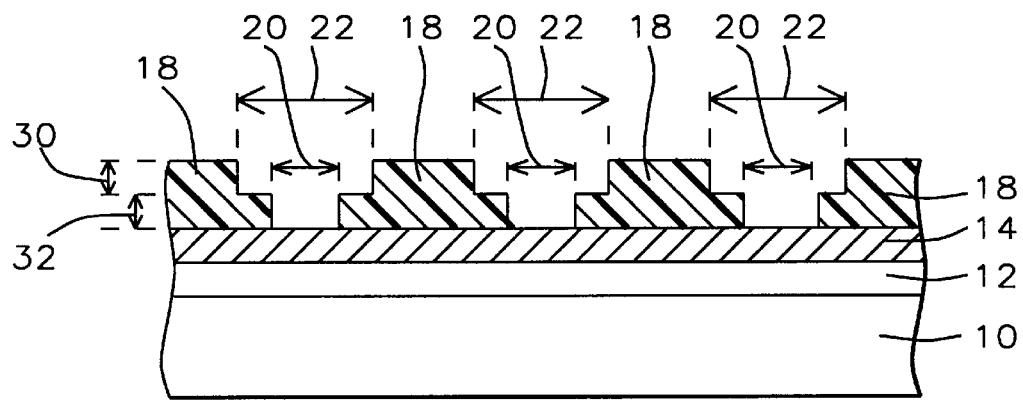
FIG. 5 shows a cross section of the transparent mask substrate, layer of attenuating phase shifting material, layer of opaque material, and layer of resist material after the resist layer has been developed for a first time and baked.

Next, as shown in FIG. 5, the layer of resist is developed in a single developing step and single developing solution leaving the first pattern 20 formed in the lower portion 32 of the layer of resist and the second pattern 22 formed in the top portion 30 of the layer of resist 18.

Figure 6:
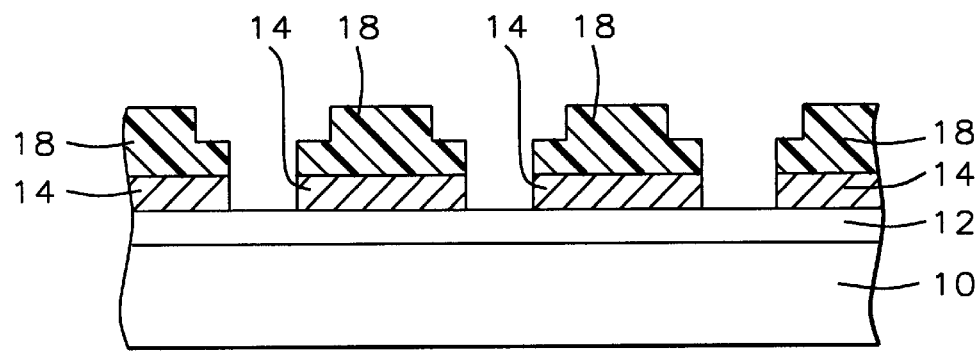
FIG. 6 shows a cross section of the transparent mask substrate, layer of attenuating phase shifting material, layer of opaque material, and layer of resist material after the first pattern has been etched into the layer of opaque material.
Figure 7:
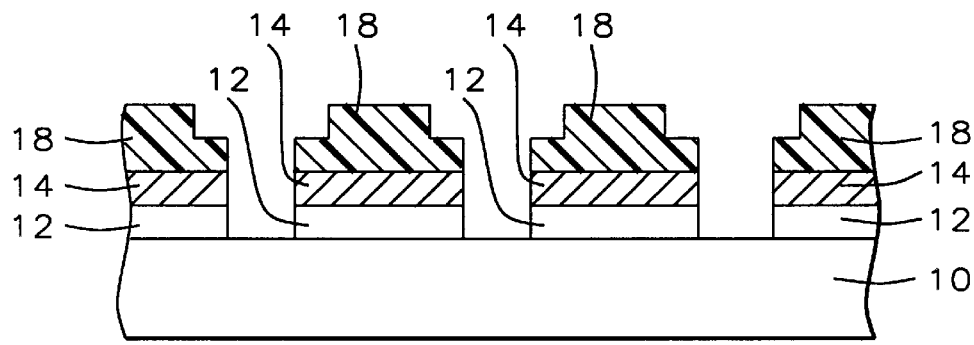
FIG. 7 shows a cross section of the transparent mask substrate, layer of attenuating phase shifting material, layer of opaque material, and layer of resist material after the first pattern has been etched into the layer of attenuating phase shifting material.

Next, as shown in FIG. 6, the first pattern is etched in the layer of opaque material 14 using wet etching methods and the developed layer of resist 18 as a mask. Next, as shown in FIG. 7, the first pattern is etched in the layer of attenuating phase shifting material using dry anisotropic etching and the developed layer of resist 18 as a mask.

Figure 8:
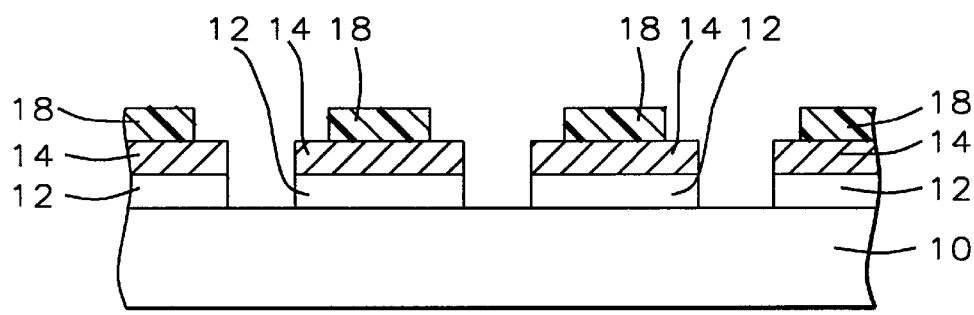
FIG. 8 shows a cross section of the transparent mask substrate, layer of attenuating phase shifting material, layer of opaque material, and layer of resist material after the layer of resist material, which has been developed for a first time, has been partially etched away leaving the second pattern in the remaining resist.
Figure 9:
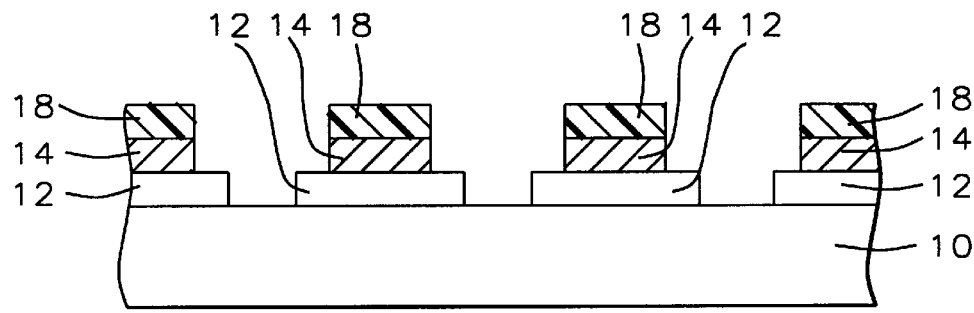
FIG. 9 shows a cross section of the transparent mask substrate, layer of attenuating phase shifting material, layer of opaque material, and layer of resist material after the second pattern has been etched into the layer of opaque material.
Figure 10:
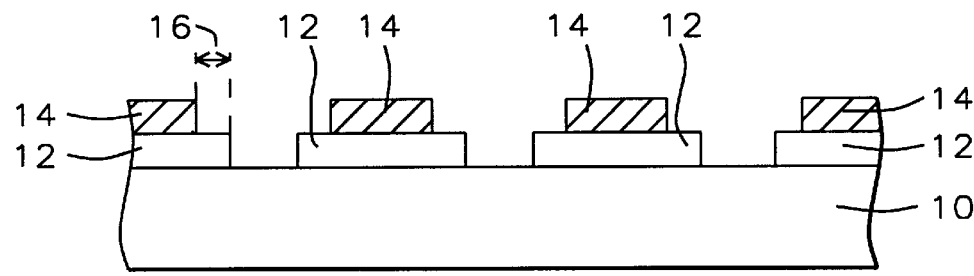
FIG. 10 shows a cross section view of the completed rim type attenuating phase shifting mask.

Next, as shown in FIG. 8, part of the layer of resist material 18 is etched away using $O_2$ plasma etching. A sufficient amount of the resist material is etched away so that the second pattern is formed in that part of the layer of resist material 18 which remains. Then, as shown in FIG. 9, the second pattern is etched in the layer of opaque material using dry anisotropic etching or wet etching and the second pattern formed in the remaining part of the layer of resist material 18 as a mask. As shown in FIG. 10, the remaining resist material is then stripped and the mask is completed.

Refer now to FIGS. 3–6 and 11–14 for another embodiment of the method of this invention for forming a rim type attenuating phase shifting mask. FIG. 3 shows a cross section of a transparent mask substrate 10 with a layer of attenuating phase shifting material 12 formed thereon. A layer of opaque material 14 is formed on the layer of attenuating phase shifting material 12. A layer of resist material 18 is formed on the layer of opaque material 14. In this example the transparent mask substrate 10 is quartz having a thickness of between about 0.2 and 0.3 inches, the layer of attenuating phase shifting material 12 is MoSiON having a thickness of between about 1000 and 1360 nanometers, and the layer of opaque material is chrome having a thickness of between about 80 and 120 nanometers. The thickness of the attenuating phase shifting material is chosen to provide a 180° phase shift, or an odd multiple of a 180° phase shift, and a transmission of between about 3% and 10% of the incident light for light having the wavelength of light which will be used to illuminate the mask when transferring a pattern to an integrated circuit wafer, in this example 365 nanometers or 263 nanometers.

This example describes a method of forming a rim type attenuating phase shifting mask. Those skilled in the art will readily recognize that the method will work equally well for the formation of rim type masks using a layer of a first mask material and a layer of a second mask material and is not restricted to attenuating phase shifting material and opaque material.

As shown in FIG. 4, the resist layer 18 is then exposed, using a first exposure dose, to a first pattern 20 using an electron beam 26. The resist layer is then exposed, using a second exposure dose, to a second pattern 22 also using an electron beam 26. The second exposure dose is less than the first exposure dose. The first exposure dose is sufficient to fully expose the entire thickness of the layer of resist material 18. The second exposure dose exposes the top part of the layer of resist to a greater degree than the lower part of the layer of resist. These exposure steps can be reversed using the second exposure dose to expose the second pattern 22 first followed by using the first exposure dose to expose the first pattern 20. In this example the layer of resist material is an electron beam resist having a thickness of between about 3000 and 5000 Angstroms, the first exposure dose is between about 5 micro-curies/cm$^2$ and 8 micro-curies/cm$^2$, and the second exposure dose is between about 2 micro-curies/cm$^2$ and 3 micro-curies/cm$^2$.

Referring again to FIG. 4, a LASER beam can also be used at two different intensity levels to expose the resist layer. In the example of a LASER beam the LASER beam is represented by the arrow indicated by Reference umber 26. In the example of a LASER beam exposure a first exposure dose of a first intensity for a first time, used to expose the first pattern 20, is greater than a second exposure dose of a second intensity of the LASER beam for a second time, used to expose the second pattern 22.

Next, as shown in FIG. 5, the layer of resist is developed for a first time in a developing solution. This developing step is sufficient to form the first pattern 20 in both the top portion 30 and the lower portion 32 of the layer of resist and the second pattern 22 in only the top portion 30 of the layer of resist. Since the first pattern 20 lies within the second pattern 22 this leaves the first pattern 20 in the lower portion 32 of the layer of resist 18 and the second pattern 22 in the top portion 30 of the layer of resist 18.

Figure 11:
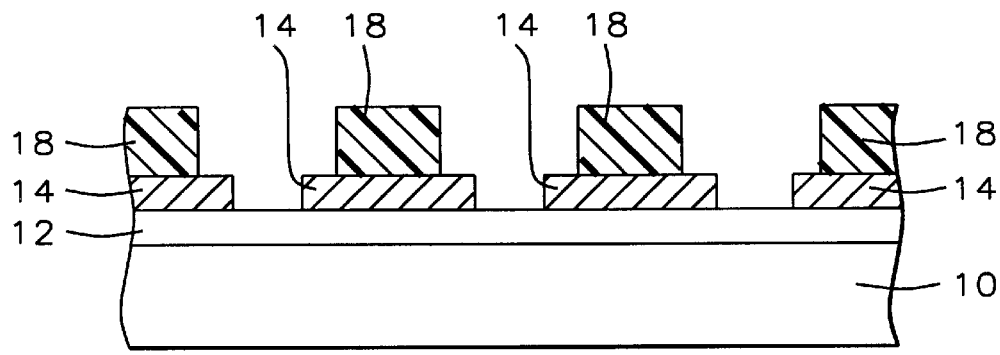
FIG. 11 shows a cross section of the transparent mask substrate, layer of attenuating phase shifting material, layer of opaque material, and layer of resist material after the layer of resist material has been developed for a first time and a second time.
Figure 12:
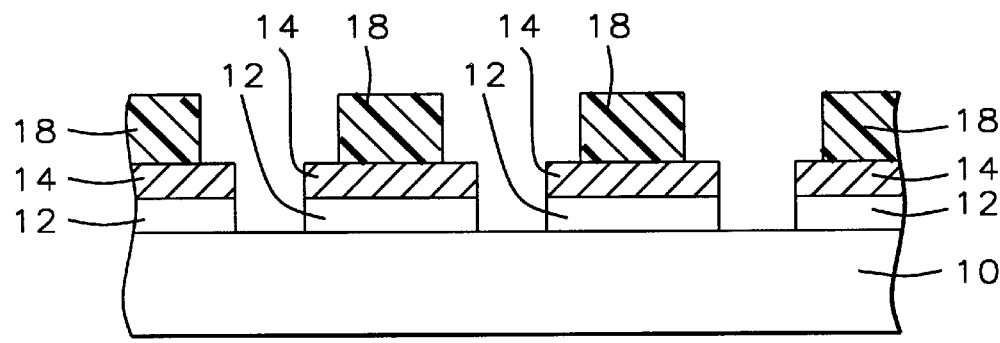
FIG. 12 shows a cross section of the transparent mask substrate, layer of attenuating phase shifting material, layer of opaque material, and layer of resist material after the first pattern has been etched in the layer of attenuating phase shifting material.
Figure 13:
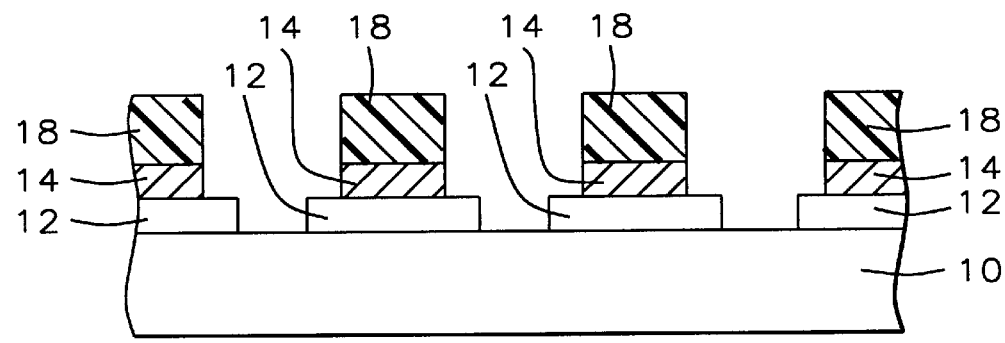
FIG. 13 shows a cross section of the transparent mask substrate, layer of attenuating phase shifting material, layer of opaque material, and layer of resist material after the second pattern has been etched into the layer of opaque material.
Figure 14:
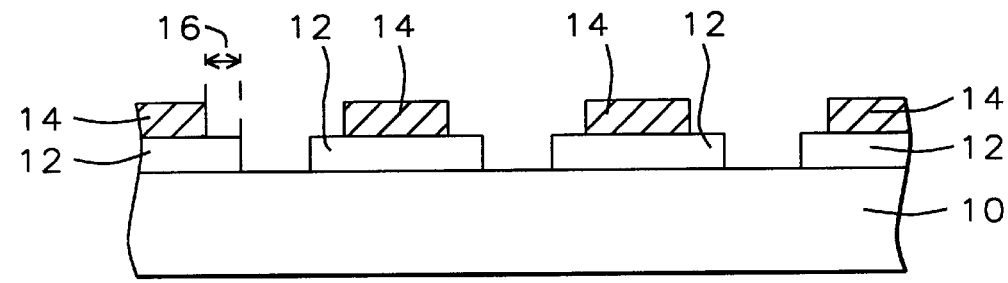
FIG. 14 shows a cross section view of the completed rim type attenuating phase shifting mask.

Next, as shown in FIG. 6, the first pattern is etched in the layer of opaque material 14 using wet etching methods and the developed layer of resist 18 as a mask. Next, as shown in FIG. 11, the layer of resist is developed for a second time in the same developing solution This developing step is sufficient to form the second pattern 22 in the lower portion of the layer of resist so that the second pattern is formed in the entire layer of resist 18. Next, as shown in FIG. 12, the first pattern is etched in the layer of attenuating phase shifting material using dry anisotropic etching and the first pattern formed in the layer of opaque material 14 as a mask. Next, as shown in FIG. 13, the second pattern is etched in the layer of opaque material 14 using dry anisotropic etching or wet etching and the second pattern formed in the layer of resist material 18 as a mask. As shown in FIG. 14, the remaining resist material is then stripped and the mask is completed.

While the invention has been particularly shown and described with reference to the preferred embodiments thereof, it will be understood by those skilled in the art that various changes in form and details may be made without departing from the spirit and scope of the invention.

What is claimed is:

1. A method of forming a photomask, comprising the steps of:

providing a transparent mask substrate having a layer of attenuating phase shifting material formed on said transparent mask substrate and a layer of opaque material formed on said layer of attenuating phase shifting material;

forming a layer of resist material having a top portion and a bottom portion on said layer of opaque material;

exposing a first pattern in said top portion and said bottom portion of said layer of resist material with a first exposure dosage;

exposing a second pattern in said top portion of said layer of resist material with a second exposure dosage, wherein said first pattern lies within said second pattern and said first exposure dosage is greater than said second exposure dosage;

developing said layer of resist material, after exposing said first pattern in said top portion and said bottom portion of said layer of resist material and exposing said second pattern in said top portion of said layer of resist material, thereby forming said second pattern in said top portion of said layer of resist material and said first pattern in said bottom portion of said layer of resist material;

etching said first pattern into said layer of opaque material using a first etching method and said first pattern formed in said bottom portion of said layer of resist material as a mask;

etching said first pattern into said layer of attenuating phase shifting material using a second etching method and said first pattern formed in said bottom portion of said layer of resist material as a mask;

partially etching away said layer of resist material using a third etching method, thereby forming said second pattern in the remaining part of said layer of resist material;

etching said second pattern in said layer of opaque material, using a fourth etching method and said second pattern formed in said remaining part of said layer of resist material as a mask, after partially etching away said layer of resist material; and removing said remaining part of said layer of resist material after etching said second pattern in said layer of opaque material.

2. The method of claim 1 wherein said layer of resist material has a thickness of between about 4000 and 6000 Angstroms.

3. The method of claim 1 wherein said layer of attenuating phase shifting material is a layer of MoSiON having a thickness of between about 1000 and 1360 nanometers.

4. The method of claim 1 wherein said layer of opaque material is a layer of chrome having a thickness of between about 80 and 120 nanometers.

5. The method of claim 1 wherein said exposing a first pattern in said top portion and said bottom portion of said layer of resist material and said partially exposing a second pattern in said top portion of said layer of resist material uses an electron beam.

6. The method of claim 1 wherein said exposing a first pattern in said top portion and said bottom portion of said layer of resist material and said partially exposing a second pattern in said top portion of said layer of resist material uses a LASER beam.

7. The method of claim 1 wherein said developing said layer of resist material after exposing said first pattern and partially exposing said second pattern in said layer of resist material uses a single developing step and a single developing solution.

8. The method of claim 1 wherein said first etching method uses wet isotropic etching.

9. The method of claim 1 wherein said second etching method uses dry anisotropic etching.

10. The method of claim 1 wherein said third etching method uses $O_2$ plasma dry anisotropic etching.

11. The method of claim 1 wherein said fourth etching method uses dry anisotropic etching or wet etching.

12. The method of claim 1 wherein said phase shift provided by said attenuating phase shifting material is 180° or an odd multiple of 180° for light having said characteristic wave length.

13. A method of forming a photomask, comprising the steps of:

providing a transparent mask substrate having a layer of attenuating phase shifting material formed on said transparent mask substrate and a layer of opaque material formed on said layer of attenuating phase shifting material;

forming a layer of resist material having a top portion and a bottom portion on said layer of opaque material;

exposing a first pattern in said layer of resist material with a first exposure dosage;

exposing a second pattern in said layer of resist material with a second exposure dosage, wherein said first exposure dosage is greater than said second exposure dosage and said first pattern lies within said second pattern;

developing said layer of resist material for a first time in a first developing solution, thereby forming said second pattern in said top portion of said layer of resist material and said first pattern in said bottom portion of said layer of resist material;

etching said first pattern into said layer of opaque material using a first etching method and said first pattern formed in said bottom portion of said layer of resist material as a mask;

redeveloping said layer of resist material for a second time in said first developing solution, thereby forming said second pattern in said bottom portion of said layer of resist material;

etching said first pattern into said layer of phase shifting material using a second etching method and said first pattern formed in said layer of opaque material as a mask;

etching said second pattern in said layer of opaque material, using a third etching method and said second pattern formed in said layer of resist material as a mask; and removing said layer of resist material.

14. The method of claim 13 wherein said layer of resist material has a thickness of between about 3000 and 5000 Angstroms.

15. The method of claim 13 wherein said layer of attenuating phase shifting material is a layer of MoSiON having a thickness of between about 1000 and 1360 nanometers.

16. The method of claim 13 wherein the phase shift provided by said attenuating phase shifting material is 180° or an odd multiple of 180°.

17. The method of claim 13 wherein said layer of opaque material is a layer of chrome having a thickness of between about 80 and 120 nanometers.

18. The method of claim 13 wherein said exposing a first pattern in said layer of resist material with a first exposure dosage and said exposing said second pattern in said layer of resist material with a second exposure dosage uses an electron beam.

19. The method of claim 13 wherein said exposing a first pattern in said layer of resist material with a first exposure dosage and said exposing said second pattern in said layer of resist material with a second exposure dosage uses a LASER beam.

20. The method of claim 13 wherein said first etching method uses wet isotropic etching.

21. The method of claim 13 wherein said second etching method uses dry anisotropic etching.

22. The method of claim 13 wherein said third etching method uses dry anisotropic etching or wet etching.

* * * * *